United States Patent [19]

Herkert

[11] 4,242,752
[45] Dec. 30, 1980

[54] CIRCUIT ARRANGEMENT FOR CODING OR DECODING OF BINARY DATA

[75] Inventor: Hans Herkert, Hohenschaeftlarn, Fed. Rep. of Germany

[73] Assignee: Siemens Aktiengesellschaft, Berlin & Munich, Fed. Rep. of Germany

[21] Appl. No.: 971,010

[22] Filed: Dec. 19, 1978

[30] Foreign Application Priority Data

Dec. 30, 1977 [DE] Fed. Rep. of Germany ....... 2759106

[51] Int. Cl.³ .......................................... G06F 11/10
[52] U.S. Cl. .................................................... 371/37
[58] Field of Search ............ 340/146.1 AL, 146.1 BE; 364/200 MS File, 900 MS File; 371/37, 38

[56] References Cited

U.S. PATENT DOCUMENTS

| | | | |
|---|---|---|---|
| 3,452,328 | 6/1969 | Hsiao et al. | 340/146.1 AL |
| 3,678,469 | 7/1972 | Freeman et al. | 340/146.1 AL |
| 3,703,705 | 11/1972 | Patel | 340/146.1 AL |
| 4,105,999 | 8/1978 | Nakamura | 340/146.1 AL |
| 4,107,650 | 8/1978 | Luke et al. | 340/146.1 AL |

OTHER PUBLICATIONS

"Pocket Guide", Texas Instruments, Sep. 1976, p. 296.
MC 5-86, User's Manual, Intel Corp., Jun. 1977, p. 41.

*Primary Examiner*—Charles E. Atkinson
*Attorney, Agent, or Firm*—Hill, Van Santen, Steadman, Chiara & Simpson

[57] ABSTRACT

The invention relates to a circuit arrangement for coding or decoding wherein check bits are formed using a cyclic code, in which an information polynomial is divided by a generator polynomial. The coding permits adaptation to the checking requirements in the simplest manner. The invention provides apparatus for dividing the binary information into a plurality of words of equal bit numbers, a modulo-2-adder, and a partial decoder. The partial decoder divides the words by the generator polynomial and the remainder determined is added to the next word in the modulo-2-adder. The partial coder can be an ROM. The circuit arrangement is particularly suitable for utilization in telecontrol installations.

5 Claims, 3 Drawing Figures

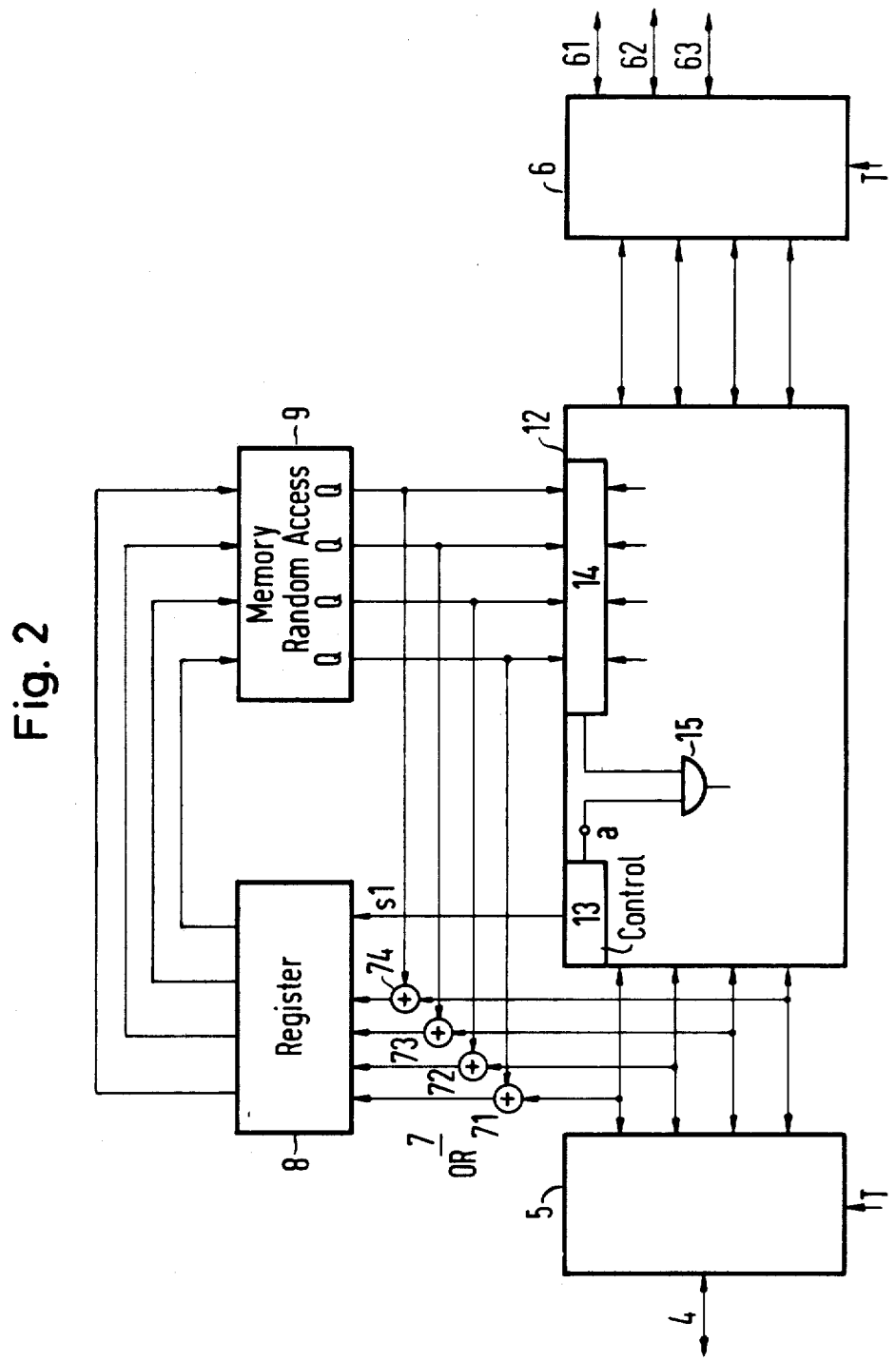

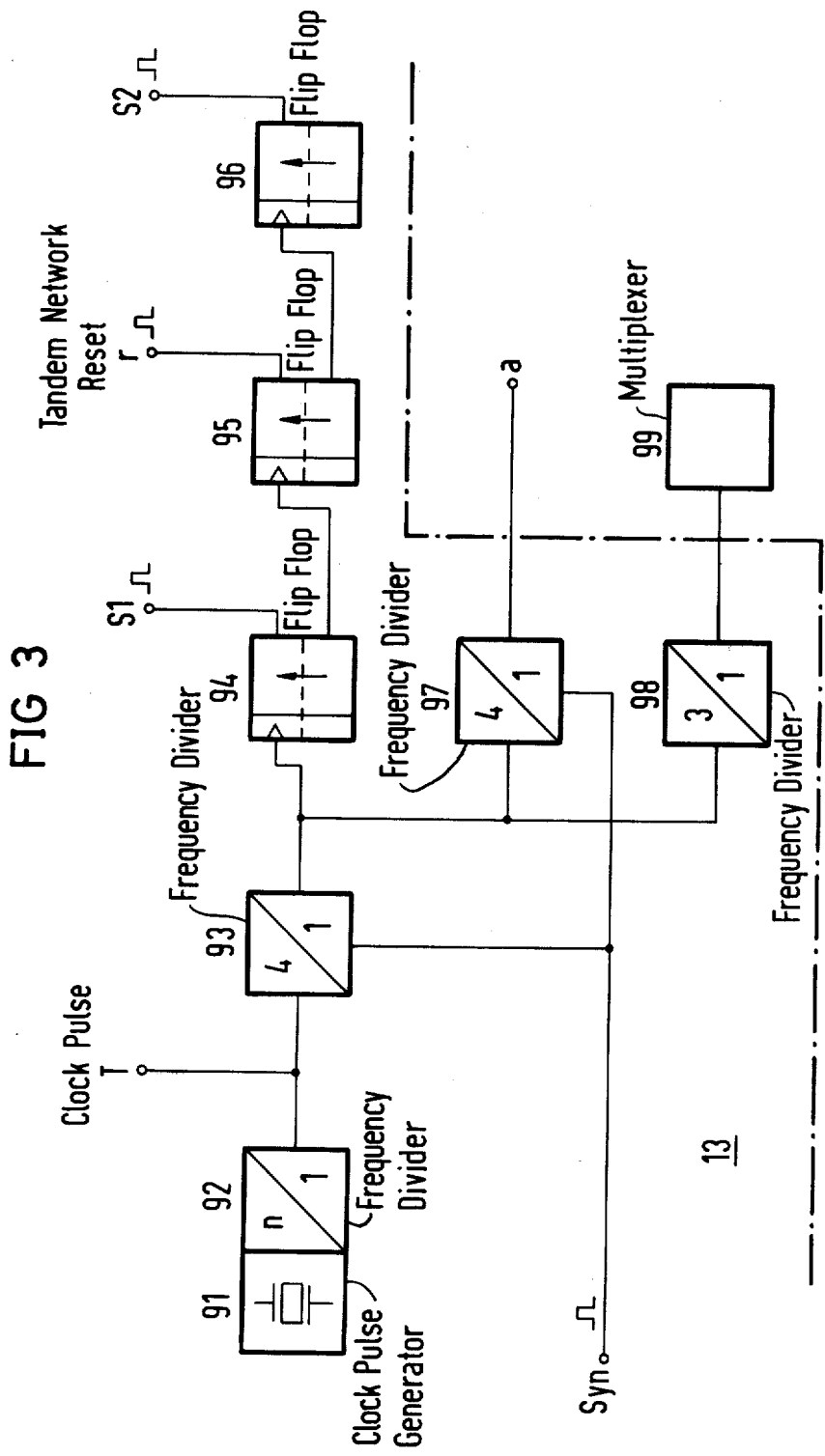

CIRCUIT ARRANGEMENT FOR CODING OR DECODING OF BINARY DATA

BACKGROUND OF THE INVENTION

1. Field of the Invention

The invention relates to a circuit arrangement for coding or decoding, comprising an installation for the formation of a number of check bits in dependence upon binary data or information which has a plurality of digit positions, and uses, a cyclic code, whereby, by means of a coder, an information polynomial is divided by a generator polynomial, and the remainder of the division is the result of the coding.

2. Description of the Prior Art

A circuit arrangement of this type is described in the book of J. Swoboda, "Coding for Error Correction and Error Recognition" at page 108.

SUMMARY OF THE INVENTION

For coding and decoding pulse telegrams, cyclic codes are frequently employed. Such codes offer, with a specified number of check steps, or with a predetermined redundancy, respectively, the greatest possible probability of error recognition. In a cyclic code, an information polynomial is valid when it is divisible by a generator polynomial without a remainder. Thus, it is always the division remainder which is of interest; not, however, the division results. Each information polynomial is, therefore, also a multiple of a generator polynomial. Likewise, the information polynomial must have a greater degree than the generator polynomial, otherwise it would not be divisible by the generator polynomial.

Polynomials being one degree smaller than the generator polynomial form the remainder or remainder powers of the generator polynomial. From the remainders, the check steps are formed during transmission of the digital information. During transmission of digital information, such a check or control bit pattern is annexed to the message or information bits such that the information polynomial will again be divisible by the generator polynomial without a remainder. The selection of the generator polynomial determines the code size and hence the probability of error recognition.

For the division of an information polynomial by a generator polynomial it is known to utilize a feedback shift register. The number of memory cells of the shift register is as great as the degree of the generator polynomial, and the feedback loops are formed with exclusive OR circuits corresponding to the format of the generator polynomial. A clock pulse shifts the information polynomial through the shift register, where it is divided by the generator polynomial by means of the feedback loops. At the end of the digital information, the division remainder is in the memory cells of the shift register. If the division remainder in the memory cells is log O, then the information is valid.

During transmission of the digital information, the division remainder in the memory cells forms the check signal elements which are appended to the message or information bits of the information.

The cyclic codes have received special significance due to the possibility of determining, with a suitable feedback shift register, the division remainder which results during the division of an information polynomial by a generator polynomial.

However, the coding and decoding of cyclic codes has its limits, e.g., in the case of rapid parallel data transmission, or in the case of data processing installations wherein serial data are received or transmitted by input-/output interfaces, but which are processed in parallel within the processing installation.

An additional difficulty which can occur in utilizing feedback shift registers consists in that the circuit arrangement for coding cannot be adapted, or can be adapted only with very large circuit-outlays, to a new code or to codes with varying lengths.

Accordingly, it is the object of the invention to design a circuit arrangement of the type designated in greater detail above such that it can be adapted, in the simplest manner possible, to the respective requirements.

Considerations of the invention have resulted in the finding that, in solving this problem, the check bits can be advantageously obtained by means of a plurality of successive division operations.

In accordance with the invention, the circuit arrangement is designed such that the coder contains apparatus for dividing the binary information into a plurality of words of equal bit numbers, a modulo-2-adder, and a partial coder, and that the partial coder divides the information supplied to it by the generator polynomial, and delivers at its output the remainder resulting from the division, and that the words and the remainder, respectively, previously determined by the partial coder, are capable of delivery to the module-2-adder in chronological sequence, and that the information supplied to the partial coder is the information obtained through the modulo-2-addition.

The binary information can be parallel or serial information, particularly, a pulse train. The binary information is split up into several parts of equal lengths which, in an extreme case, can consist of one bit. The first part is divided by the generator polynomial, the division remainder is added modulo-2 manner to the next information part, etc., until the binary information has been processed.

The advantage resulting from these measures is that the circuit arrangement can be adapted to the requirements of the respective application without elaborate changes in circuitry. If the words are several bits wide, then a particularly high processing speed can be obtained in the case of parallel data processing.

In a further embodiment of the invention, the circuit arrangement is designed in such a fashion that the partial coder is a feedback shift register which is resettable by means of an installation for functional sequence control, and which is clock-pulse controllable, and the shift register receives the information obtained by means of modulo-2-addition as parallel information.

A particularly high speed can be obtained for the coding by virtue of the fact that the partial coder is a random access memory whose address inputs are connected to the output of the modulo-2-adder, and in which the information resulting from division of the address by the generator polynomial is stored for each address.

Expediently, the random access memory is a read-only memory, i.e., a ROM. In addition, it is possible to expediently connect to the output side of the modulo-2-adder a register controllable by the apparatus for functional sequence control.

In a further development of the invention, the circuit arrangement is designed such that the binary information is supplied in a bit-wise fashion to the modulo-2-adder, and that the free inputs of the modulo-2-adder are connected to the logic state 0.

Other objects, features and advantages will be apparent from the following description and claims when read in view of the drawings.

BRIEF DESCRIPTION OF THE DRAWINGS

FIG. 2 illustrates a circuit arrangement for information coding and decoding with an ROM; and FIG. 3 is a block diagram illustrating details of the invention.

DESCRIPTION OF THE PREFERRED EMBODIMENTS

Figure 1:
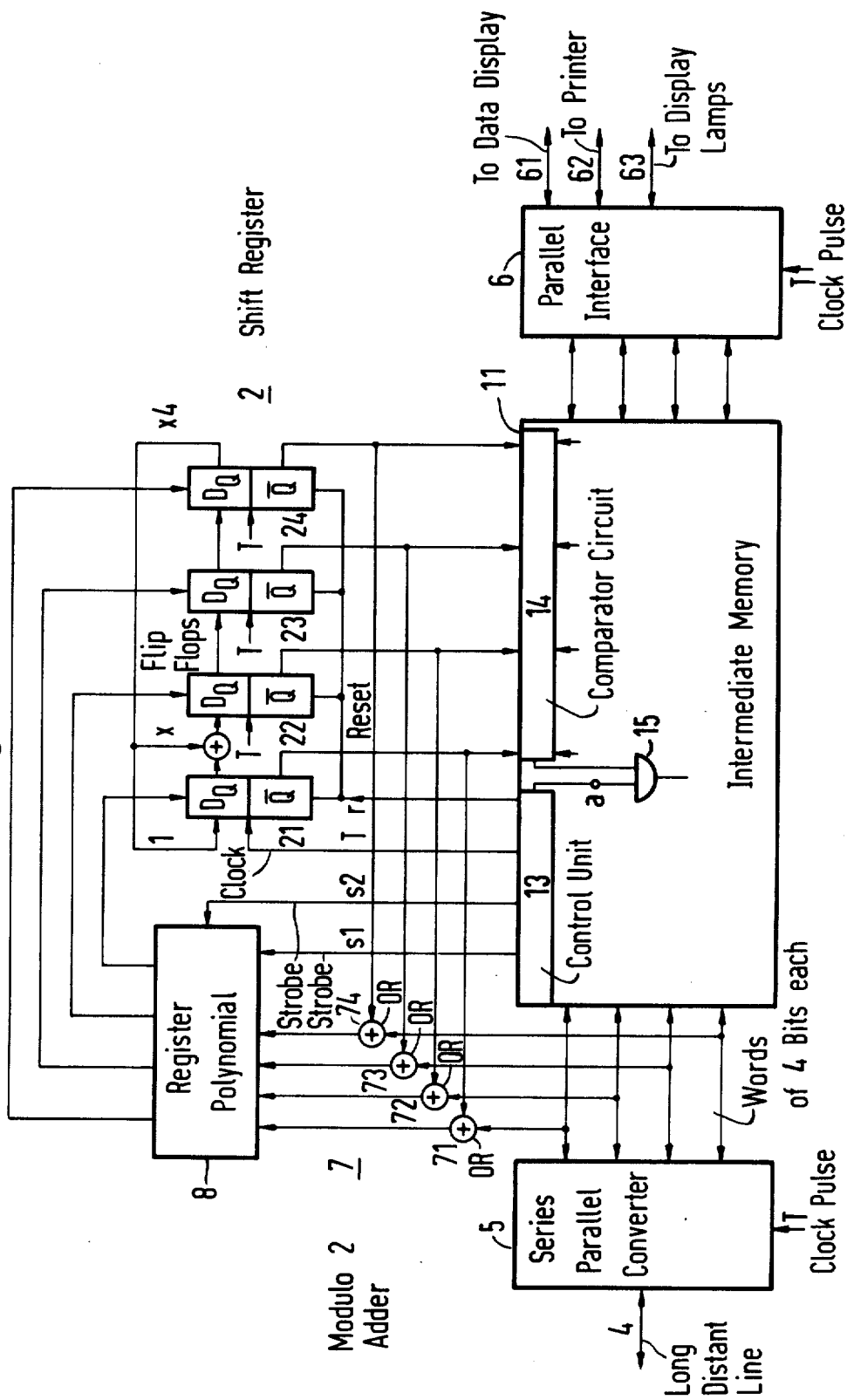
FIG. 1 illustrates a circuit arrangement for information coding and decoding comprising a shift register.

The pulse series, or information, respectively, is represented as a polynomial, whereby the last information signal element has the degree of 0.
Example:

Information: 1 0 0 1 1

Polynomial: $1 \cdot x^4 + 0 \cdot x^3 + 0 \cdot x^2 + 1 \cdot x^1 + 1 \cdot x^0 = x^4 + x + 1$;
It is not permissible to insert for the variable x any number from the set of all numbers, but only a bit pattern from the set of the remainder powers. Discovery of suitable generator polynomials for a specified code size is the task of linear algebra. The generator polynomial is here assumed as given. For the following explanations, the generator polynomial $x^4 + x + 1$ is always used.

The coefficients of the polynomial have the two values 0 and 1. Two polynomials are added by adding the variables x with the same exponents. The addition of the coefficients follows the modulo-2-law.

In addition, the polynomial can be shifted or displaced to the left through multiplication with x. This multiplication with x corresponds to a shifter pulse.

FIG. 1 illustrates a circuit arrangement for a coding and decoding in the case of parallel information processing with a register.

In this circuit arrangement, the long-distance line 4 is connected to a series-parallel-interface comprising the series-parallel converter 5, which is controlled by the clock pulse T. The binary information serially transmitted via long distance line 4 is converted, with the aid of the series-parallel-converter 5, into parallel information which consists of words of four bits each. The words are supplied to an information intermediate memory contained in installation 11, not illustrated in the Figure, on the one hand, and to the modulo-2-adder 7, on the other hand. The modulo-2-adder 7 consists of the four exclusive-OR-members 71 through 74, which execute a modulo-2-addition for one digit position of the word, respectively. The other inputs of the modulo-2-adder 7 are connected to the output of the shift register 2.

The outputs of the exclusive OR-members of the modulo-2-adder 7 are supplied to the register 8 which is controlled with strobe pulses S1 and S2 from the installation 11 which serves the purpose of functional sequence control and is preferably a microprocessor.

The output of register 8 is conveyed to the inputs of the D-flip-flops 21 through 24. These D-flip-flops 21 through 24 are connected as a feedback shift register, and form a partial coder which divides the parallel information released from register 8 by the generator polynomial $x^4 + x + 1$. The clock pulse inputs of the D-flip-flops receive from installation 11 a clock pulse T; and the reset pulses r.

The remainder signal resulting after the division by the generator polynomial is connected to the outputs of the D-flip-flops 21 through 24 as parallel information. This information is conveyed to installation 11, and to one of the two inputs of the modulo-2-adder.

In addition, there is connected to installation 11 the parallel-interface 6, controlled by the clock pulse T, which has a connection 61 for output devices such as a data display apparatus, a connection 62 for a printer, and a connection 63 for display lamps, etc.

At the Q-outputs of the D-flip-flops 21 through 24, contained in the polynomial-shift register, the division remainder at the end of the serial information run is available, i.e., the inverted division remainder is available at the Q-outputs. The division remainder must be 0 during reception of information. During transmission of the information, it forms the check signal elements.

In case pulse information is received, the control part 13 of the installation 11 sets, with a reset pulse r, the polynomial-shift register 8, serving as the partial coder, into the rest or off position. The pulse information, arriving serially from long distance line 4 is transmitted in a four-bit-manner to the installation 11 and to the register 8. The information output at the output of the polynomial shift register 8 is added in modulo-2 fashion with a word, respectively, of the information incoming in a four-bit-fashion. The resulting additional word is loaded into register 32 by means of a strobe pulse S1. A second strobe pulse S2 loads the contents of register 32 into the polynomial shift register 8. The following 4 clock pulses T divide this information portion by the generator polynomial. The remainder resulting after division is added with the next four bits of the information with the use of the modulo-2-adder 7 according to the modulo-2-law, and loaded into the polynomial shift register 8 via register 32. Four clock pulses also divide this information portion, and so on, until the last four information bits enter. They must, added in modulo-2 fashion with the division remainder from the polynomial shift register, result in the word 0 0 0 0. The division remainder is supplied to comparator 14 whose output signal is evaluated with the use of the AND circuit 15 at a time specified by control unit 13. If the division remainder after the last four telegram bits is 0 0 0 0, then the installation 11 further processes the information. Otherwise, the information is rejected or an error correction is conducted.

The information division can be represented as follows.

| Information | | | | | | | | | | | | | | | |
| --- | --- | --- | --- | --- | --- | --- | --- | --- | --- | --- | --- | --- | --- | --- | --- |
| 0 | 1 | 1 | 0 | 1 | 0 | 1 | 0 | 0 | 0 | 1 | 0 | 0 | 1 | 1 | 0 |
| is split up into | | | | | | | | | | | | | | | |
| 0 | 1 | 1 | 0 | 0 | 0 | 0 | 0 | | | | | | | | |
| plus | | | | | | | | | | | | | | | |
| | | | | 1 | 0 | 1 | 0 | 0 | 0 | 0 | 0 | | | | |
| plus | | | | | | | | | | | | | | | |
| | | | | | | | | 0 | 0 | 1 | 0 | 0 | 0 | 0 | 0 |

| -continued | | | | |
|---|---|---|---|---|
| Information | | | | |
| plus | 0 | 1 | 1 | 0 |

The first information portion is divided by the generator polynomial, and the remainder is added in modulo-2 fashion to the next information portion. The latter is again divided and the remainder is added to the next information portion. The remainder of the next to the last information portion, which is added modulo-2 to the last information portion, must result in the remainder 0 0 0 0.

During transmission of the information, the installation 11 sets, with the reset pulse, the polynomial shift register 2 into the off position. The parallel interface 6 supplies the information messages and the activation signal for transmitting information. The installation 11 transmits the information in four-bit-fashion to the series parallel interface 5 and to the coding installation. If all message bits have been transmitted, then installation 11 appends the division remainder at the output of the polynomial shift register to the message bits in the form of check bits, and thus terminates the information. For the remainder, the coding operation is executed as in the case of a received binary information.

In the example described, the digit position number of the check appendix corresponds to the bit number of the words. Possibly, the words can contain more bits. In this instance, a parallel series converter for the additional bits is to be connected with the feedback shift register.

If the words have fewer bits than the check appendix, the free inputs of the modulo-2-adder are connected in the logic state 0.

FIG. 2 illustrates a circuit arrangement for coding and decoding in the case of parallel information processing with a register and an ROM. This circuit installation differs from that of FIG. 1 in that, instead of the polynomial shift register 2, a memory 9 with random access is provided. The memory 9 is a read-only memory, or ROM, respectively. The address input of memory 9 is connected to the output of register 8. The output of memory 9 is conveyed, with its Q-connections, to one input, respectively, of the exclusive OR-gates 71 through 74 contained in the modulo-2-adder. Moreover, the installation 12 for functional sequence control is also connected to the output of memory 9.

An additional difference of the apparatus of FIG. 2 relative to the circuit arrangement illustrated in FIG. 1, is that only one single line for a strobe pulse S1 is required from installation 12 to register 8.

Since each bit pattern written into the polynomial shift register 2 in FIG. 2 yields a defined, different bit pattern following the polynomial division, the shift register 2 can be advantageously replaced by a memory 9 with random access which can be a ROM. This circuit arrangement permits particularly rapid information processing, because memory 9, or the ROM, respectively, supplies the result immediately, and not after several shifter pulses where a polynomial shift register is used.

The circuit arrangement can be advantageously utilized in installations for data transmission, particularly for the purpose of coding or decoding of remote control digital data. Remote control data can be falsified by interference voltages during the transmission from one remote control station to the other via long distance lines. Therefore, the digital data transmitter expediently annexes to the information several check signal elements whose bit pattern is dependent upon the bit pattern of the message bits into which the information is coded. The digital data receiver checks the message bits and the check bits, and, with a defined probability, recognizes an error and the information is decoded.

Register 8 can, e.g., be of a type SN 74 S 374 described in Pocket Guide, Texas Instruments, Edition September 1976, page 296.

In the design of the installations 11, or 12, respectively, which can be a microprocessor, which can additionally be utilized for additional operations or controls, e.g., for the cyclic cell-up of remote control stations.

FIG. 3 illustrates further details of the installation 11 according to FIG. 1. The clock pulse T, supplied by clock pulse generator 91 and the output-connected frequency divider 92, corresponds to the bit rate of the pulse series. This clock pulse T is divided by means of the frequency divider 93 by a ratio of 4:1, so that a clock pulse is available for the half-byte obtained by a series-parallel conversion. Connected to the output side of the frequency divider 93 is the additional frequency divider 97 whose divider ratio is 4:1.

The synchronization signal Syn, occurs at the beginning of the pulse series, and is supplied to the frequency dividers 93 and 97 to set them to zero. At output a of the frequency divider 97, a control signal is available with the aid of which the comparison result supplied by comparator 14 (FIG. 1) is evaluated after the fourth half-byte.

In addition, there is connected to the frequency divider 93 the chain circuit or tandem network formed with the monostable flip-flops 94 to 96, so that the required strobe or reset pulses, respectively, are available at the outputs S1,r and S2 of the monostable flip-flops 94 . . . 96. The duration of these pulses is in a particular example of approximately 0.5 msec.

In addition, there is connected to the output of frequency divider 93 the frequency divider 96 whose divider ratio is 3:1. The multiplexer 97, which is connected thereto, serves during transmission of the information of first providing through-connection of the information and then subsequently the check signal elements.

In the installation 12 in FIG. 2, the monostable flip-flops 97 and 98 can be eliminated.

The installation 11 can be, e.g., a microprocessor type Intel 8008, to which "Programmable Communication Interfaces Type 8251" can be connected as described in MC 5-85 USER'S MANUAL, June 1977, Page 41.

Although the invention has been described with respect to certain preferred embodiments, it is not to be so limited as changes and modifications can be made as defined by the appended claims.

I claim as my invention:

1. Apparatus for receiving and checking incoming digital data comprising, a series parallel converter receiving on a long distant line incoming serial information and converting it to a plurality of equal bit length words which are supplied in parallel to a plurality of word lines, an intermediate memory connected to said plurality of word lines, a modulo-2 adder which receives first inputs from said plurality of word lines, a polynomial register which receives a plurality of outputs from said modulo-2 adder and dividing such inputs by a generator polynomial, a partial decoder receiving a plurality of outputs from said register and supplying a plurality of outputs to said intermediate memory and to second inputs of said modulo-2 adder, a comparator means in said intermediate memory receiving outputs from said partial decoder and detecting whether the information content in said incoming digital data is valid, and output means connected to said intermediate memory and receiving the output data if said incoming data is valid.

2. Apparatus according to claim 1 wherein said partial decoder is a shift register and said intermediate memory is connected to supply a reset pulse thereto.

3. Apparatus according to claim 1 wherein said partial decoder is a random access memory.

4. Apparatus according to claim 1 wherein said partial decoder is a read only memory.

5. Apparatus according to claim 2 wherein said intermediate memory includes a control unit which supplies timing inputs to said shift register and said polynomial register.

* * * * *